(12) United States Patent
Van De Ven et al.

(10) Patent No.: US 7,123,344 B2
(45) Date of Patent: Oct. 17, 2006

(54) LITHOGRAPHIC APPARATUS AND DEVICE MANUFACTURING METHOD

(75) Inventors: Bastiaan Lambertus Wilhelmus Marinus Van De Ven, Den Bosch (NL); Erik Leonardus Ham, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 197 days.

(21) Appl. No.: 10/671,588

(22) Filed: Sep. 29, 2003

(65) Prior Publication Data

US 2005/0078284 A1    Apr. 14, 2005

(51) Int. Cl.
  *G03B 27/42* (2006.01)
  *G03B 27/62* (2006.01)
(52) U.S. Cl. .......................... 355/53; 355/75
(58) Field of Classification Search ............ 355/30, 355/53, 75; 414/935, 937, 939, 940
See application file for complete search history.

(56) References Cited

U.S. PATENT DOCUMENTS

| | | | | |
|---|---|---|---|---|
| 5,026,239 A * | 6/1991 | Chiba et al. | ............... | 414/217 |
| 5,730,573 A * | 3/1998 | Masujima et al. | ........... | 414/217 |
| 6,184,970 B1* | 2/2001 | Nakahara et al. | ............. | 355/53 |
| 6,281,510 B1* | 8/2001 | Yoshitake et al. | ........ | 250/492.2 |
| 6,471,037 B1* | 10/2002 | Matsumoto | ............... | 198/465.2 |
| 6,619,903 B1 | 9/2003 | Friedman et al. | ...... | 414/331.14 |
| 6,829,038 B1* | 12/2004 | Miwa | ........................... | 355/53 |
| 6,842,221 B1* | 1/2005 | Shiraishi | ...................... | 355/30 |
| 6,906,783 B1 | 6/2005 | del Puerto et al. | | |
| 6,991,416 B1* | 1/2006 | del Puerto et al. | ...... | 414/331.14 |
| 2003/0082030 A1 | 5/2003 | del Puerto et al. | | |
| 2004/0218168 A1 | 11/2004 | van Gross et al. | | |
| 2004/0263823 A1 | 12/2004 | Klomp et al. | | |
| 2005/0054217 A1 | 3/2005 | Klomp et al. | | |

FOREIGN PATENT DOCUMENTS

EP    1 341 042 A2    9/2003

* cited by examiner

*Primary Examiner*—Alan Mathews
(74) *Attorney, Agent, or Firm*—Pillsbury Winthrop Shaw Pittman LLP

(57) ABSTRACT

The invention relates to a lithographic apparatus including an illumination system for providing a projection beam of radiation, a support structure for supporting patterning means, the patterning means serving to impart the projection beam with a pattern in its cross-section, a dust-right storage container defining a storage space for storing patterning structures, wherein the storage container is arranged to be coupled with a transfer container such that the transfer container for exchanging patterning structures between the transfer container and the lithographic apparatus through a closeable passage between the transfer container and the storage container, a substrate table for holding a substrate and a projection system for projecting the patterned beam onto a target portion of the substrate. Furthermore, the invention relates to a method of using such an apparatus.

23 Claims, 9 Drawing Sheets

LITHOGRAPHIC APPARATUS AND DEVICE MANUFACTURING METHOD

BACKGROUND OF THE INVENTION

1. Field of the Invention

The present invention relates generally to lithographic projection apparatus and more specifically to lithographic projection apparatus including contamination control structures.

2. Summary of the Related Art

In general, lithographic apparatus include an illumination system for providing a projection beam of radiation, a support structure for supporting patterning means, the patterning means serving to impart the projection beam with a pattern in its cross-section, a substrate table for holding a substrate, a projection system for projecting the patterned beam onto a target portion of the substrate, a dust-tight storage container defining a storage space for containing patterning means, wherein the storage container is arranged to be coupled with a transfer container for exchanging patterning means through a closeable passage between the transfer container and the storage container.

A lithographic apparatus is a machine that applies a desired pattern onto a target portion of a substrate. Lithographic apparatus can be used, for example, in the manufacture of integrated circuits (ICs). In that circumstance, a patterning means, such as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

If a new or different pattern has to be imaged on a substrate or wafer then the lithographic apparatus has to be provided with appropriate corresponding patterning structure. Preferably, the patterning structures have to be transferred from a station were the patterning structures are stored and/or manufactured to the lithographic apparatus such that it is delivered to the latter in an essential clean (dust-free) status. For this transfer use is made of transfer containers which enclose the patterning means such that it is stored dust-free.

It is an object of the present invention to provide a system of a lithographic apparatus, patterning structures and a transfer container for such patterning structures, which system is suited for a wide range of applications including for example for projection of Extreme UltraViolet radiation (EUV) on a substrate. Using EUV radiation poses extra requirements on the system as a consequence of specific properties of EUV radiation (note for example that EUV radiation is absorbed in air).

A solution known in the art for providing an EUV projection system (for example see U.S. Pat. No. 5,730,573) is to provide a transfer container which can be placed in a transfer position against the lithographic apparatus, wherein the transfer container forms part of an outer wall of a vacuum chamber of the lithographic apparatus. However, a disadvantage of this solution is that the transfer container has to be designed and arranged such that it has a vacuum compatible construction (being able to withstand relative large pressure differences). This means that no conventional transfer containers can be used with this system. Moreover, if the used transfer container has a vacuum malfunction, the said vacuum chamber of the lithographic apparatus cannot be brought in a vacuum state.

Another solution in the art for providing an EUV compatible system (for example, see U.S. Pat. No. 6,281,510) is to move a dust-tight but non-vacuum compatible transfer container completely in an unload position in a vacuum chamber of the lithographic apparatus, subsequently to pump the vacuum chamber vacuum, after which the patterning means is brought into a vacuum illumination position. A disadvantage of this solution is that it is difficult and time consuming to bring the transfer container completely in an unload position in the vacuum chamber while guaranteeing an accurate placement of the transfer container. Furthermore, bringing the complete transfer container in the vacuum chamber brings the risk of the vacuum chamber to become contaminated with dust particles, while cleaning the vacuum chamber is an awkward job and a source of expensive maintenance.

SUMMARY OF THE INVENTION

One aspect of the present invention alleviates problems associated with the prior art. For this, the lithographic apparatus according to the prior art is characterized in that the lithographic apparatus is adopted for realizing the coupling such that the transfer container forms a non vacuum compatible part of an outer wall of the storage spa, and that the lithographic apparatus also includes a vacuum chamber for receiving patterning means via or from the storage container. This enables the use of a conventional non-vacuum transfer container for transferring the patterning structure into a vacuum environment of the lithographic apparatus for example according to a two step procedure as explained below.

In the first step, patterning structures are brought into the storage space. Herewith only a relatively small part of the transfer container and only a small part of the storage container are moved together with the patterning means into the storage space. These relatively small parts can easily kept dust-free (by cleaning regularly) and even if the transfer container or the lithographic apparatus is contaminated at an outer wall only a small part of this is brought into the storage space. Consequently, the storage space can easily be kept essentially dust-free.

In the second step, the patterning structures are brought in the vacuum chamber (which vacuum chamber is at that moment not in a vacuum condition). Then the vacuum chamber can be pumped into a vacuum condition. Preferably the vacuum chamber is connected via an air-tight closed passage with a further vacuum chamber. The passage can be opened and the patterning means can be transported to a illumination position in the further vacuum chamber for patterning the projection beam.

Preferably the storage container is constructed and arranged to be coupled with the transfer container such that a shutter of the storage container and a shutter of the transfer container are coupled in order to be moved simultaneously into said storage space. Herewith, it is possible that the shutter of the transfer container supports the patterning means. Then the shutter of the transfer container and/or the shutter of the storage container can be brought together with the patterning means into the storage space or into the storage container. In that case the shutters are the above mentioned relatively small parts being brought into the storage space or storage container.

According to one embodiment, while moving patterning structures into the storage space, outer parts of the shutters move outwards from (on the outside of) the storage space and only inner parts of the shutters move inwards (thus into) the storage space together with the patterning structures. It is noted that, by definition, respective outer parts of the shutters lie opposite to respective inner parts, wherein the respective inner parts are defined as parts comprising the content of the respective container. This embodiment may have the advantage that, in the even that dust particles have collected at the outer side of the transfer container and/or the outer side of the storage container, no dust-particles are brought into the storage space.

Furthermore, the lithographic apparatus can be provided with a holder for holding, or just holding in position, the patterning structures which are placed inside the storage space. In addition a sliding construction can be provided for sliding walls of a vacuum chamber over the holded patterning means. In particular, in this way, a vacuum chamber can be formed easily and without requiring much room in the said storage container.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "patterning means" or "patterning structure" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning means may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning means, the support structure may be a frame or table, for example, which may be fixed or movable as required and which may ensure that the patterning means is at a desired position, for example with respect to the projection system. Any use of the terms "reticle" or "mask" herein may be considered synonymous with the more general terms "patterning means."

The term "projection system" used herein should be broadly interpreted as encompassing various types of projection system, including refractive optical systems, reflective optical systems, and catadioptric optical system, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be cared out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DETAILED DESCRIPTION

Now the invention will be elucidated by describing embodiments of the invention which are meant as an example only, with reference to the accompanying schematic drawings in which corresponding reference symbols indicate corresponding parts.

Figure 1:
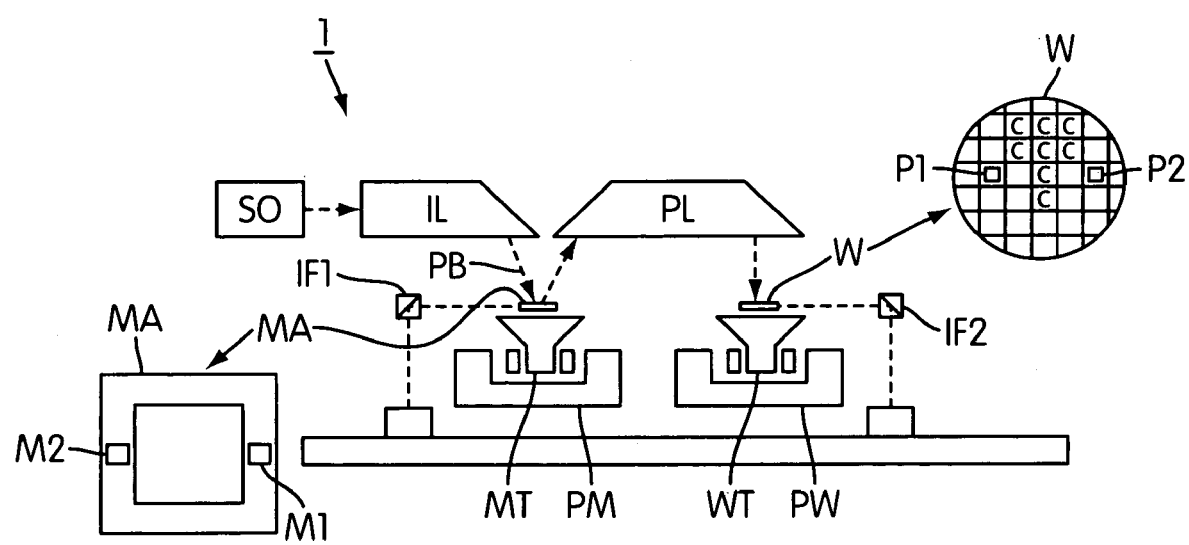
FIG. 1 is a schematic overview of a lithographic apparatus according to the invention.

FIG. 1 schematically depicts a lithographic apparatus 1 as used in embodiments of the invention. The apparatus includes, an illumination system (illuminator) IL for providing a projection beam PB of radiation (e.g., UV or EUV radiation), a first support structure (e.g., a mask table or reticle table) MT for supporting patterning means (e.g., a mask or reticle) MA and connected to first positioning means PM for accurately positioning the patterning means with respect to item PL, a substrate table (e.g., a wafer table) WT for holding a substrate (e.g., a resist-coated wafer) W and connected to second positioning means PW for accurately positioning the substrate with respect to item PL and a projection system (e.g., a reflective projection lens) PL for imaging a pattern imparted to the projection beam PB by patterning means MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or spectral purity filter. In other cases the source may be integral part of the apparatus, for example when the source is a mercury lamp. The source SO and the illuminator IL, may be referred to as a radiation system.

The illuminator IL may comprise a system for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PS passes through the lens PL, which focuses the beam onto a target portion C of the substrate W. With the aid of the second positioning means PW and position sensor IF2 (e.g., an interferometric device), the substrate table WT can be moved accurately, e.g., so as to position different target portions C in the path of the beam PB. Similarly, the first positioning means PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate able WT are kept essentially stationary, while an entire pattern imparted to the projection beam is projected onto a target portion C in one go (i.e., a single static exposure). Be substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

FIGS. 2A–2F present an illustration of the cooperation between a first embodiment of a lithographic apparatus 2 according to the invention having a storage container 4 (sometimes also called "loadlock") for cooperation with a transfer container 6. This embodiment is especially suited for illumination of the substrate by Extreme UltraViolet radiation as will be clear from the explanation hereafter.

The transfer container 6 is a dust-tight container such that a (or a multiple of) mask(s) or reticle(s) (thus patterning means) 8 inside this container can be transported while protected from, for example, dust particles. Dust particles can have length dimensions in the order of magnitude of 50 [nm]. Preferably, walls of the transfer container are even particle tight such that certain molecules like $H_2O$ and $C_xH_y$ (hydrocarbons) cannot penetrate into the transfer container when it is closed, such that a minimum degree of purity can be maintained. The transfer container 6 shown in FIG. 2 is a conventional transfer container 6 which is not suitable to be used as a vacuum container. Thus, walls of the transfer container 6 are not adapted to withstand pressure differences in the order of magnitude of 1 Bar. In this example the transfer container 6 has a bottom part 10 which can be disconnected from other parts of the housing of the transfer container 6 by applying a downwards oriented force exceeding a threshold value which is defined by pins 12. Consequently, the bottom part 10 can function as a shutter of the transfer container 6. The bottom part is connected to support mechanism 14 for supporting the mask 8.

The storage container 4 shown in FIG. 2 defines a storage space 16 for temporarily holding the mask(s) of the lithographic apparatus when these masks are received from the transfer container 6. The storage container of the lithographic apparatus surrounds the storage space 16 in such a way that the storage space 16 is essentially kept free from dust particles. It is noted that the storage container 4 has a shutter 18, placed in or as part of an outer wall of the storage container 4, which shutter 18 in this example can be opened by means of an transporter mechanism 20, in this case an elevator mechanism 20. From FIG. 2B it follows that the storage container 4 is arranged to be coupled with the transfer container 6. This coupling can be performed by placing the master container 6 to an outer wall part of the storage container 4 in the neighborhood of the shutter 18. Under the force of gravity and/or pressing springs the coupling can be realized with a dust-tight well aligned connection, in addition, contacting means like connecting/clicking pins, suction elements, resilient contact strips (such as rubber strips) and/or alignment recesses in outer wall parts can help to establish a thorough connection.

Figure 2A:
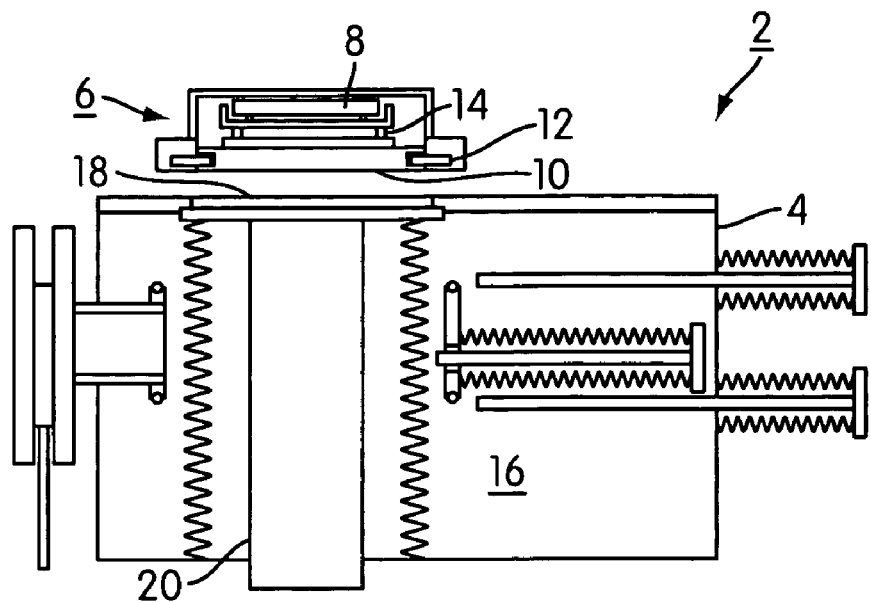
FIGS. 2A–2G are side views illustrating the cooperation between a transfer container for patterning means and a first embodiment of a lithographic apparatus according to the invention.
Figure 2B:
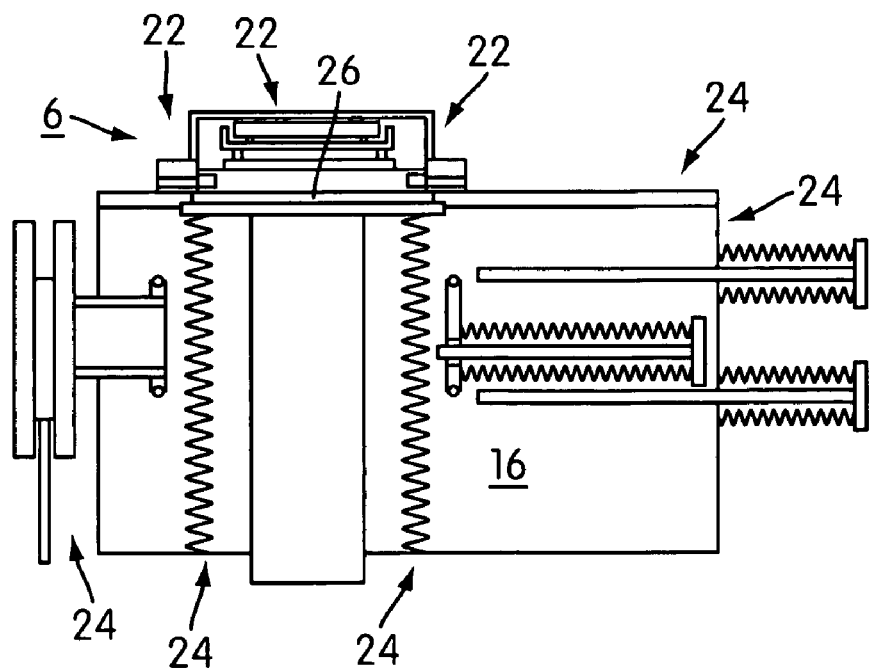

After the said coupling has taken place, the transfer container 6 forms a non-vacuum compatible part (indicated with the area 22) of an outer wall 24 of the storage space 16 for exchanging patterning means 8 between the transfer container 6 and the lithographic apparatus through a closeable passage 26 between the transfer container 6 and the storage container 4. In this example the non vacuum compatible part is not adapted to withstand relative large pressure differences (in this specific example differences larger than 0.5 or 0.7 Bar). FIG. 2B depicts a situation wherein the passage 26 is closed by the shutters 10, 18. The support bar 28 of the elevator mechanism 20 is connected with shutter 18 which on its turn is connected with shutter 10. Shutter 10 is arranged for supporting the mask(s) reticle(s) 8.

Figure 2C:
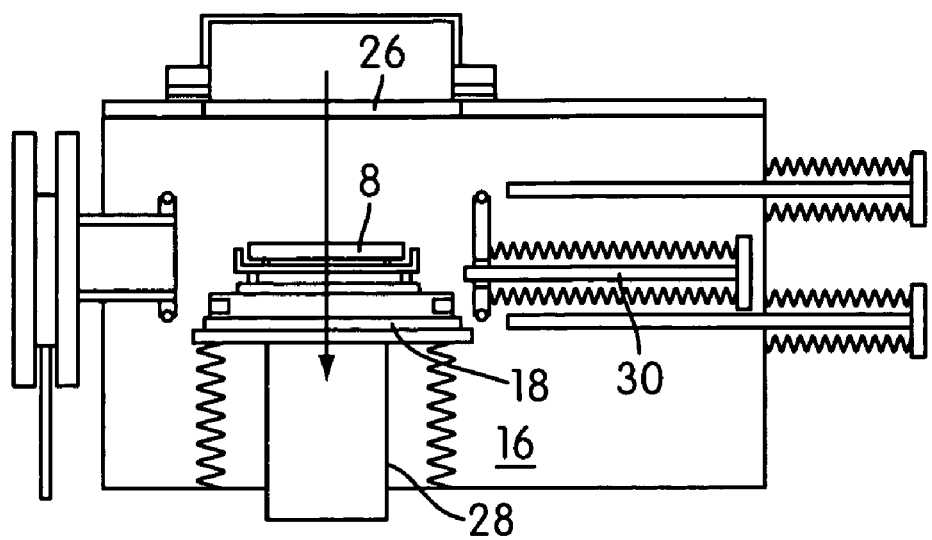

Next, as illustrated in FIG. 2C, by lowering support bar 28 of the elevator mechanism 20, the passage 26 is opened and the mask(s) or reticle(s) 8 are brought in the essentially dust-free storage space 16.

Figure 2D:
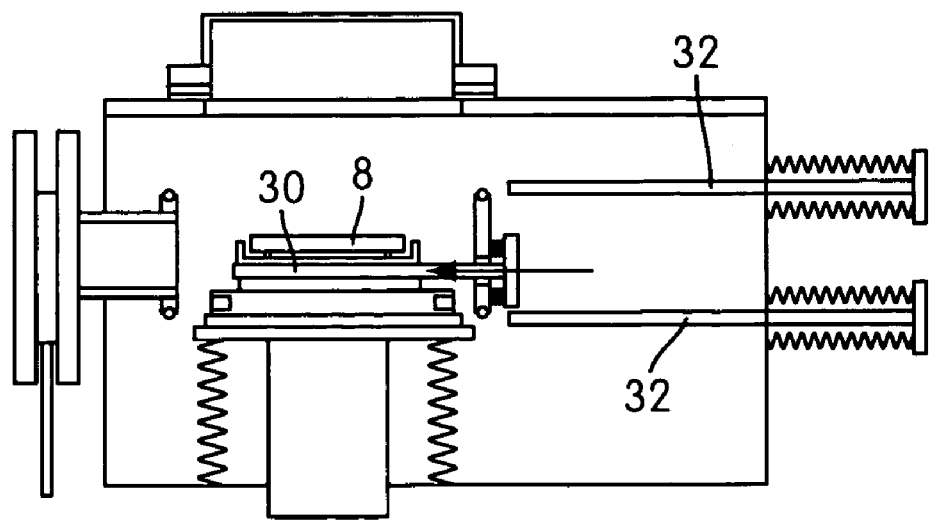
Figure 2E:
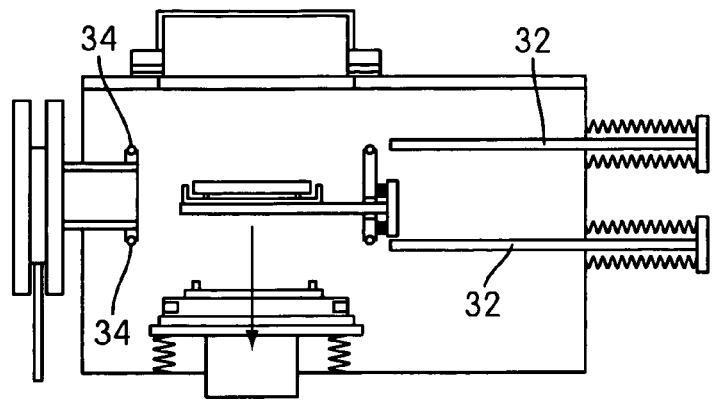

FIG. 2D shows how a holder 30 for holding the patterning means 8 (which are already moved inside the storage space 16 by the elevator 20) for supporting, lifting or upholding the patterning means 8. Then the elevator mechanism 20, in this example more specifically the bar 28, can move away, for example further downwards (FIG. 2E) or sideways.

Figure 2F:
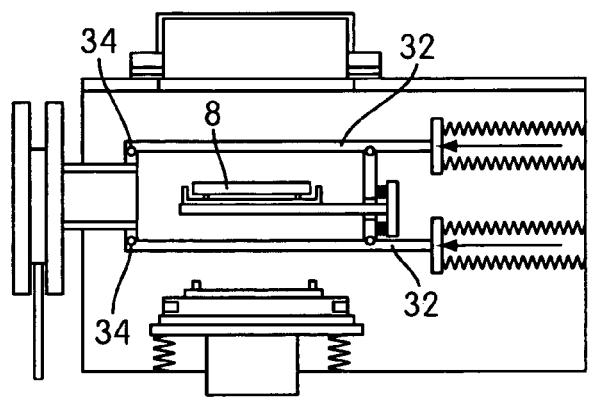

In a next step, as shown in FIG. 2F, wall portions 32 are slided around the holded patterning means 8 (mask(s) or reticle(s)) against an abutment 34. The abutments are arranged to make an air tight connection with the wall portions 32. Preferably the abutment is of a resilient material such as rubber. In this way a vacuum chamber 36 is formed around the patterning means 8. The vacuum chamber 36 is pumped vacuum by means of as pump 38 schematically indicated in FIG. 2G. The vacuum chamber 36 is thus used for receiving the patterning means 8 via the storage container 4. Note that the lithographic apparatus is provided with the vacuum pump 38 for evacuating air from the vacuum chamber 36, and that the pump 38 can be place either inside or outside vacuum chamber 36, and either inside or outside the storage space 16.

Figure 2G:
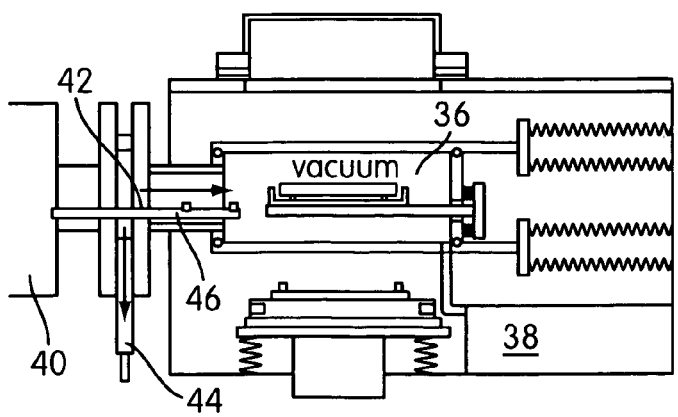

As schematically shown in FIG. 2G, the lithographic apparatus according to the invention can comprise a further vacuum chamber 40 which is connected with the vacuum chamber 36 via a passage 42 which is closeable with vacuum closing means 44. Furthermore, the lithographic apparatus also can comprise transfer means 46 for transferring patterning means 8 through the passage into an illumination position. Such an illumination position is for example schematically depicted in FIG. 1. In FIG. 1, patterning means MA (a mask) are shown, in a vacuum environment, for reflecting a projection beam PB towards a projection lens PL as is explained herein before.

Note that, during transport of the transfer container 6, dust particles can have been collected on outer part of its walls, in particular dust can collect on the outside of the shutter 10. Also, when no transfer container is coupled with the shutter 18, dust particles can have been collected easily at the outside of the shutter 18. In the example of FIG. 2 the storage container 4 is constructed and arranged to be coupled with the transfer container 6, wherein a part of the shutter 18 of the storage container and a part of the shutter 10 of the transfer container 6 are coupled in order to be moved subsequently simultaneously into said storage space (see FIG. 2C). In this coupling procedure, these dust particles are clamped between the shutters 18 and 10 such that at least most of these particles do not come free in the storage space when the patterning means pass through the passage 26.

In the phase of FIG. 2C it is advantageous to apply an intermediate vacuum between the shutter 10 (thus the bottom of the transfer container 6) and the shutter 18 which is moved by the elevator mechanism 20. The intermediate vacuum results in a thorough clamping of the shutter 10 and the shutter 18 such that dust-particles and/or molecules entered from the outside world into the storage space 16 via outside parts of the shutters 10 or 18 do not come free in the storage space 16.

According to a very advantageous approach for further reducing the risk of contamination of the storage space 16, wherein it has to be guaranteed that no (or at least almost none) clamped dust particles and/or molecules come free in the storage space 16, a coupling structure for coupling the transfer container 6 and the storage container 4 is possible wherein, in use, while moving the patterning means 8 into the storage space 16, respective outer parts of the respective shutters 10, 18, which parts possibly are contaminated with dust particles, move outwards from the storage space or at least sideways (not inside storage space 16) from the passage 26, and respective inner parts (which are not contaminated with dust particles) of the respective shutters 10, 18 move inwards the storage space (for example together with the patterning means).

Figure 3A:
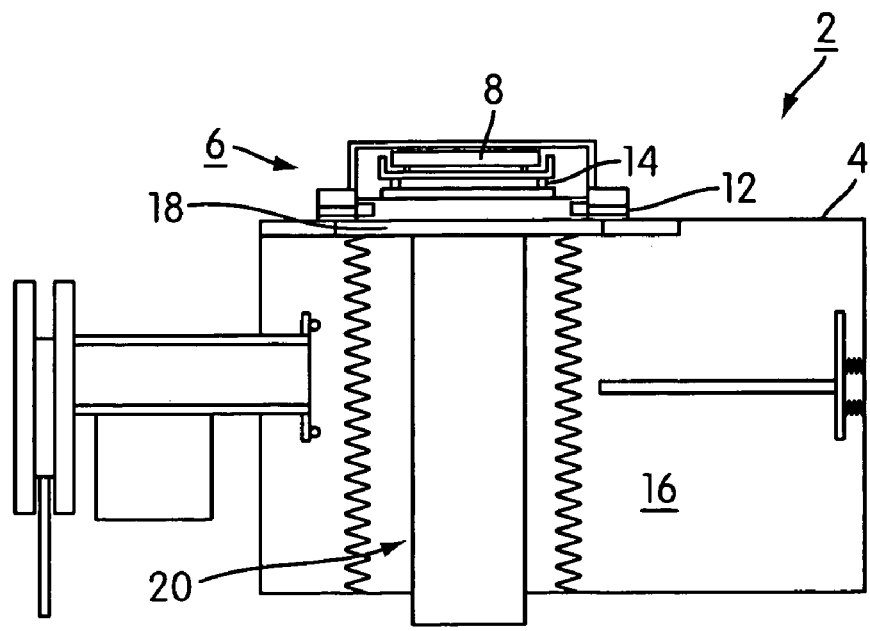
FIGS. 3A–3F are side views illustrating the cooperation between a transfer container for patterning means and a second embodiment of a lithographic apparatus according to the invention.
Figure 3B:
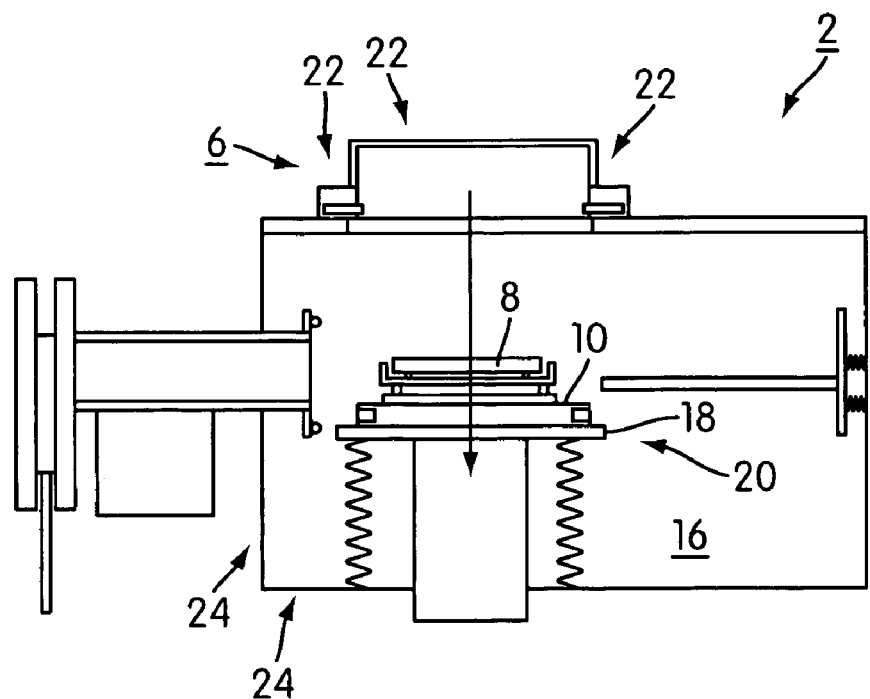
Figure 3C:
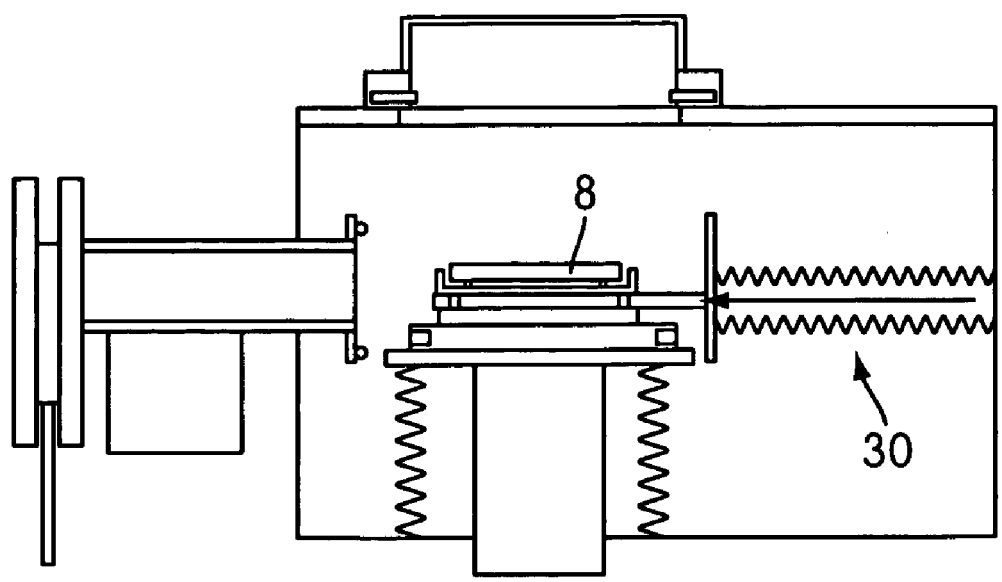
Figure 3D:
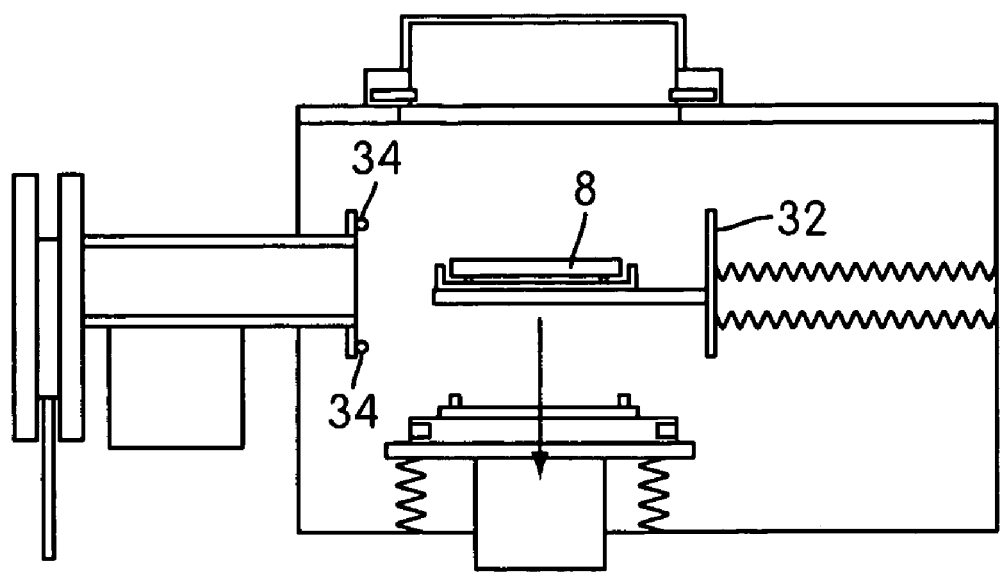
Figure 3E:
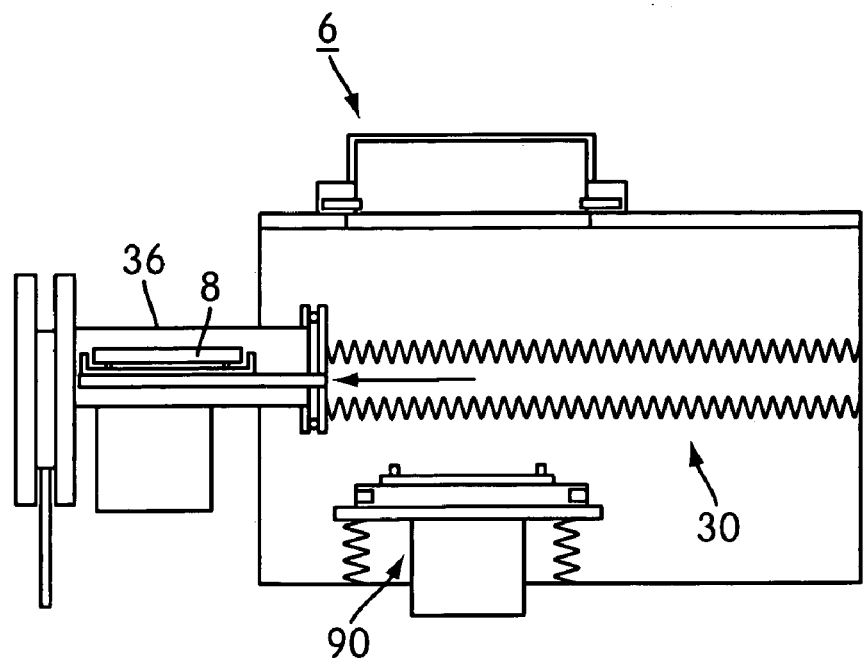
Figure 3F:
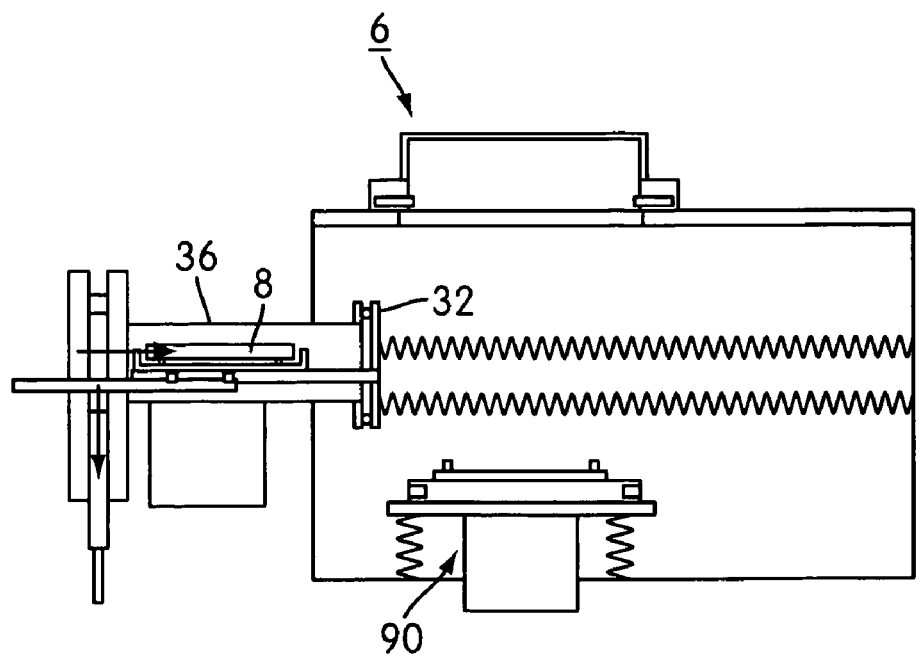

FIG. 3A–3F show part of a second embodiment of a lithographic apparatus according to the invention comprising a storage container 4 in cooperation with a transfer container 6. In FIG. 3A the containers 4, 6 are coupled. FIG. 3B shows how the elevator mechanism 20 lower the shutters 10, 18 plus the supported patterning means 8 into the clean atmosphere of the storage space 16 Next, FIG. 3C shows how a holder, in this example the lift 30, are used for lifting or holding the patterning means 8. Then, as shown in FIG. 3D, the elevator is moved away from the lift 30. As indicated in FIG. 3E, the lift 30 moves, while holding the patterning means, into vacuum chamber 36. During this move wall parts 32 make contact with abutments 34, such that the vacuum chamber 36 is formed. Next, air is pumped out of the vacuum chamber 36. Hereafter, the passage is opened by moving away shutter an the patterning means 8 can be moved into another vacuum environment for use and for example for EUV illumination applications in the lithographic apparatus.

Figure 4A:
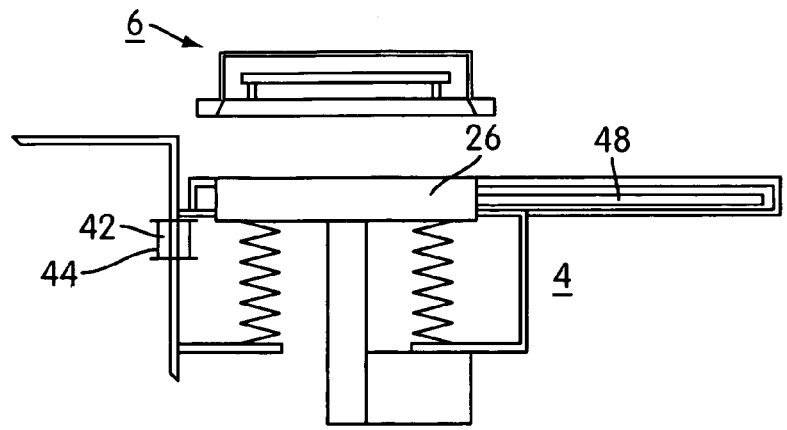
FIGS. 4A–4E are side views illustrating the cooperation between a transfer container for patterning means and a third embodiment of a lithographic apparatus according to the invention.
Figure 4B:
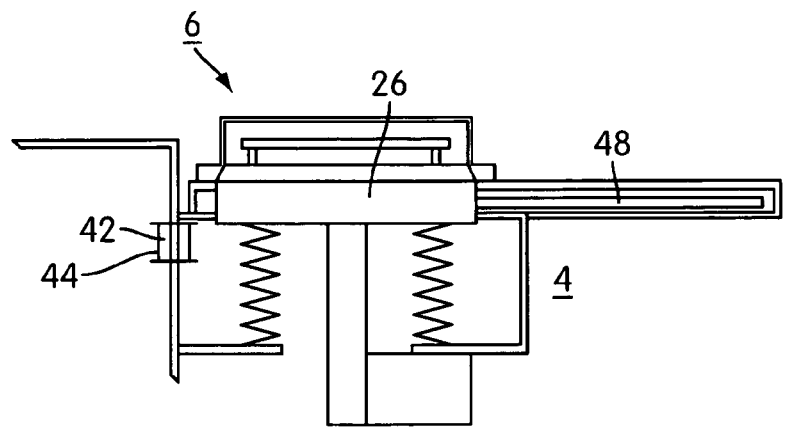
Figure 4C:
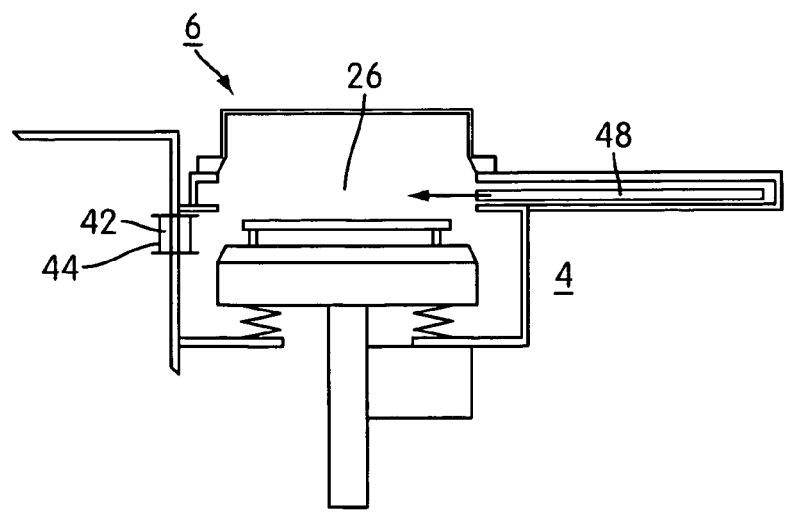
Figure 4D:
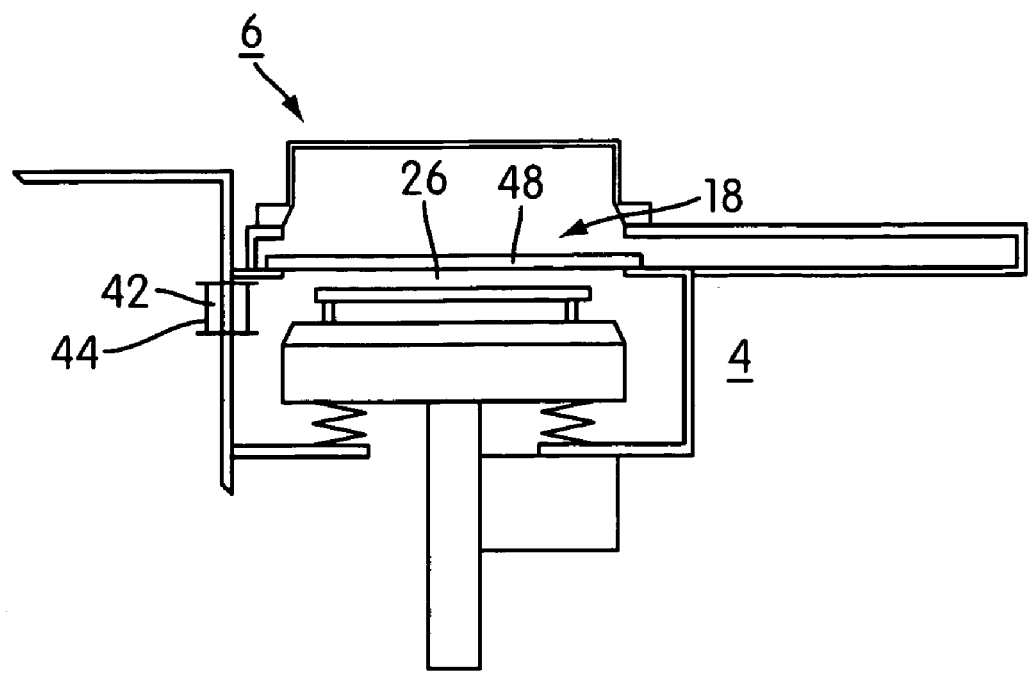
Figure 4E:
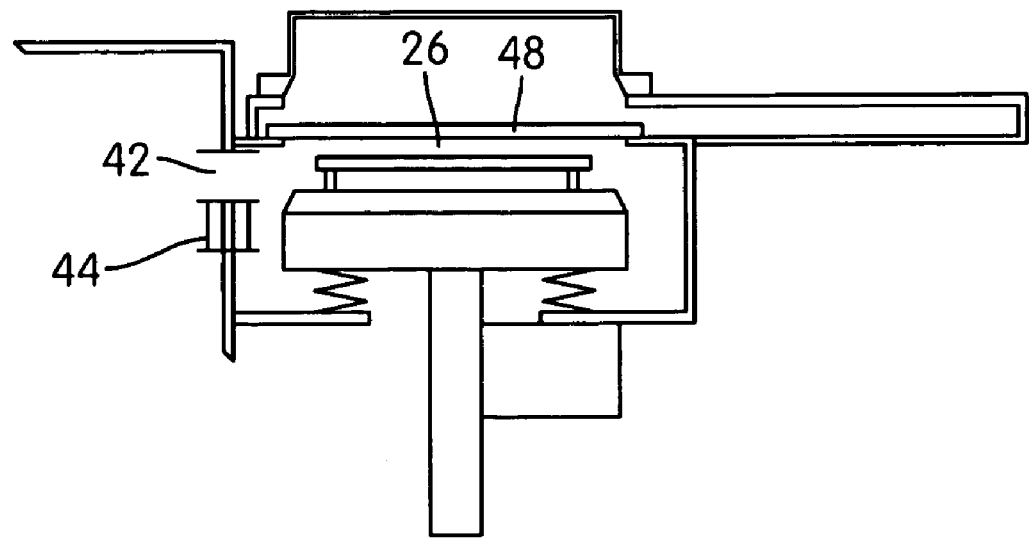

FIG. 4A–4E show part of a third embodiment of a lithographic apparatus according to the invention, comprising a storage container 4 in cooperation with a transfer container 6. The storage container 4 has a shutter 18 which in this example includes a slideable plate 48 which can move along the outer wall of the storage container 4 for opening or closing the passage 26. An advantage of this construction is that dust particles which are collected on top of the plate 48 are not brought into the storage space 16. In FIG. 4A the transfer container 6 is transported and moved towards the storage container 4. FIG. 4B shows how the transfer container and the storage container are coupled. The FIG. 4C illustrates how patterning means 8 supported by a moved bottom part (shutter 10) of the transfer container are moved into the storage space 16. FIG. 4D shows how the plate 48 of shutter 10 moves to a closing position for closing passage 26. In this example, the plate is able to generate an air tight closing of the passage 26. Next, air can be pumped out of the storage space and thereafter the patterning means can be transported to another vacuum environment via a passage 42. For this, the passage 42 can be opened by moving a shutter 44.

Note that the transfer container can in another embodiment also be coupled to a side-wall of the lithographic apparatus 2 (more in particular the storage container 4), such that the transporter mechanism operates in a horizontal configuration instead of the more vertical configuration of the current depicted elevator mechanism 20. In the lager case the holder can transport the patterning means in a horizontal plane although a displacement in a vertical direction is also possible.

While specific embodiments of the invention have been described above, it will be appreciated that the invention may be practiced otherwise than as described. The description is not intended to limit the invention.

What is claimed is:

1. A lithographic apparatus comprising:
    a support structure to support a patterning structure, the patterning structure serving to impart a beam of radiation with a pattern in its cross-section;
    a substrate table configured to hold a substrate;
    a projection system to project the patterned beam of radiation onto a target portion of the substrate;
    a dust-tight storage container defining a non-vacuum storage space to contain at least one patterning structure, wherein the storage container is arranged to be coupled with a transfer container to exchange said at least one patterning structure through a closeable passage between the transfer container and the storage container, the passage closeable using a shutter of the storage container; and
    a vacuum chamber to receive said at least one patterning structure via or from the storage container.

2. A lithographic apparatus according to claim 1, wherein the transfer container is particle-tight.

3. A lithographic apparatus according to claim 1, wherein the lithographic apparatus further comprises a vacuum pump to evacuate gas from the vacuum chamber.

4. A lithographic apparatus according to claim 1, wherein the lithographic apparatus further comprises a further vacuum chamber in fluid communication with the vacuum chamber via a passage which is vacuum closeable and a transfer mechanism to transfer said at least one patterning structure through the passage.

5. A lithographic apparatus according to claim 1, wherein the storage container is constructed and arranged to be coupled with the transfer container such that a part of a shutter of the storage container and a part of the shutter of the transfer container are coupled in order to be moved simultaneously into said storage space.

6. A lithographic apparatus according to claim 5, wherein the shutter of the storage container, the shutter of the transfer container, or both, is arranged to support the patterning structure.

7. A lithographic apparatus according to claim 5, wherein in use, while moving the patterning structure into the storage space, respective inner parts of the respective shutters move into the storage space together with the patterning structure.

8. A lithographic apparatus according to claim 1, wherein the lithographic apparatus further comprises a holder to hold the patterning structure when moved inside the storage space.

9. A lithographic apparatus according to claim 8, wherein the lithographic apparatus further comprises slideable walls forming walls of the vacuum chamber.

10. A lithographic apparatus according to claim 1, wherein said vacuum chamber is arranged inside the non-vacuum storage space of the dust-tight storage container.

11. A lithographic apparatus according to claim 1, further comprising slideable wall portions arranged within said dust-tight storage container, said slideable wall portions enclosing at least part of said vacuum chamber.

12. A lithographic apparatus according to claim 11, wherein said slideable wall portions are configured to abut a portion of a passage that connects said vacuum chamber to a further vacuum chamber.

13. A lithographic apparatus according to claim 11, wherein said slideable wall portions are separate from wall portions that define said dust-tight storage container.

14. A lithographic apparatus according to claim 1, further comprising a transfer device, said transfer device including a wall portion enclosing at least part of said vacuum chamber.

15. A method of manufacturing a device comprising:
    connecting a substantially dust-tight, non vacuum-compatible transfer container in a dust-tight transfer position against an outer portion of a lithographic apparatus;
    transferring a patterning structure from the transfer container into a substantially dust-tight non-vacuum storage space of the lithographic apparatus through an opening closeable by a moveable part of the outer portion of the lithographic apparatus;
    transferring the patterning structure from the storage space into a vacuum chamber;
    illuminating the transferred patterned structure with a beam of radiation to form a patterned beam of radiation; and
    projecting the patterned beam of radiation onto a target portion of a substrate.

16. A device manufacturing method according to claim 15, further comprising:
    pumping the vacuum chamber to produce a substantially vacuum ambience;
    transferring the patterning structure from the vacuum chamber into a further vacuum chamber in a substantially vacuum state, wherein the patterning structure is placed into an illumination position in the further vacuum chamber for forming the patterned beam.

17. A device manufacturing method according to claim 15, further comprising forming said vacuum chamber inside the dust-tight non-vacuum storage space of the storage container.

18. A device manufacturing method according to claim 10, further comprising moving simultaneously into said storage space a part of a shutter of the storage container and a part of the shutter of the transfer container.

19. A lithographic apparatus, comprising:
a support structure to support a patterning structure, the patterning structure serving to impart the beam of radiation with a pattern in its cross-section;
a substrate table configures to hold a substrate;
a projection system to project a patterned beam of radiation onto a target portion of the substrate;
a dust-tight storage container defining a non-vacuum storage space to contain at least one patterning structure, wherein the storage container is arranged to be coupled with a transfer container to exchange said at least one patterning structure through a closeable passage between the transfer container and the storage container; and
a vacuum chamber, arranged inside the non-vacuum storage space of the dust-tight storage container, to receive said at least one patterning structure via or from the storage container.

20. A lithographic apparatus according to claim 19, further comprising a slideable wall arranged within said dust-tight storage container, said slideable wall enclosing at least part of said vacuum chamber.

21. A lithographic apparatus according to claim 20, wherein said slideable wall is configured to abut a portion of a passage that connects said vacuum chamber to a further vacuum chamber.

22. A lithographic apparatus according to claim 19, further comprising a transfer device, said transfer device including a wall enclosing at least part of said vacuum chamber.

23. A lithographic apparatus according to claim 19, wherein the storage container is constructed and arranged to be coupled with the transfer container such that a part of a first shutter of the storage container and a part of a second shutter of the transfer container are coupled in order to be moved simultaneously into said storage space.

* * * * *